(12) United States Patent
Vartiainen et al.

(10) Patent No.: US 11,448,876 B2
(45) Date of Patent: Sep. 20, 2022

(54) METHOD OF MANUFACTURING A HEIGHT-MODULATED OPTICAL DIFFRACTIVE GRATING

(71) Applicant: Dispelix Oy, Espoo (FI)

(72) Inventors: Ismo Vartiainen, Espoo (FI); Jussi Rahomäki, Espoo (FI); Mikhail Erdmanis, Espoo (FI)

(73) Assignee: Dispelix Oy, Espoo (FI)

( * ) Notice: Subject to any disclaimer, the term of this patent is extended or adjusted under 35 U.S.C. 154(b) by 389 days.

(21) Appl. No.: 16/618,176

(22) PCT Filed: May 22, 2018

(86) PCT No.: PCT/FI2018/050383
§ 371 (c)(1),
(2) Date: Nov. 29, 2019

(87) PCT Pub. No.: WO2018/220271
PCT Pub. Date: Dec. 6, 2018

(65) Prior Publication Data
US 2021/0157134 A1    May 27, 2021

(30) Foreign Application Priority Data
Jun. 2, 2017 (FI) ...................................... 20175504

(51) Int. Cl.
*G02B 5/18* (2006.01)
*G02B 27/01* (2006.01)
(Continued)

(52) U.S. Cl.
CPC ....... *G02B 27/0101* (2013.01); *G02B 5/1847* (2013.01); *G02B 5/1857* (2013.01);
(Continued)

(58) Field of Classification Search
CPC ............ G02B 27/0101; G02B 27/0081; G02B 27/0944; G02B 27/4233; G02B 27/095;
(Continued)

(56) References Cited

U.S. PATENT DOCUMENTS

| 6,475,704 | B1  | 11/2002 | Iwasaki et al. |
|-----------|-----|---------|----------------|
| 2009/0231702 | A1 | 9/2009 | Wu et al. |
| 2010/0134534 | A1* | 6/2010 | Seesselberg ......... G02B 6/0038 345/690 |
| 2016/0047961 | A1 | 2/2016 | Park et al. |
| 2016/0308020 | A1* | 10/2016 | Sreenivasan ...... H01L 21/31144 |

(Continued)

FOREIGN PATENT DOCUMENTS

| CN | 1116719 A | 2/1996 |
| CN | 101986173 A | 3/2011 |

(Continued)

OTHER PUBLICATIONS

David: Fabrication of stair-case profiles with high aspect ratios for blazed diffractive optical elements. Microelectronic Engineering, 2000, vol. 53, pp. 677-680.

*Primary Examiner* — Xuemei Zheng
(74) *Attorney, Agent, or Firm* — Laine IP Oy

(57) ABSTRACT

The invention concerns a method of manufacturing a height-modulated optically diffractive grating. The method comprises providing a substrate and manufacturing a plurality of temporary elements of first material onto the substrate, the elements being separated by gaps and arranged as a periodic structure comprising at least two periods having different element heights. A coating layer of second material is deposited on the plurality of temporary elements such that the coating layer fills said gaps and covers said temporary elements. Then, a uniform layer of the second material is removed in order to expose said temporary elements and the first material is removed in order to form a height modulated (Continued)

pattern of the second material onto the substrate as the optically diffractive grating. The invention relaxes manufacturing constraints when manufacturing gratings with locally varying diffraction efficiency.

20 Claims, 3 Drawing Sheets

(51) Int. Cl.
G02B 27/00 (2006.01)
G02B 27/09 (2006.01)
G02B 27/42 (2006.01)

(52) U.S. Cl.
CPC ..... G02B 27/0081 (2013.01); G02B 27/0944 (2013.01); *G02B 27/4233* (2013.01)

(58) Field of Classification Search
CPC ................ G02B 27/0172; G02B 27/42; G02B 27/0037; G02B 5/1847; G02B 5/1857; G02B 5/1866; G02B 5/18
See application file for complete search history.

(56) References Cited

U.S. PATENT DOCUMENTS

| 2017/0123208 | A1 | 5/2017 | Vallius | |
| 2018/0031744 | A1* | 2/2018 | Miller | G02B 5/1814 |
| 2018/0341090 | A1* | 11/2018 | Devlin | C23C 16/56 |

FOREIGN PATENT DOCUMENTS

| EP | 1942364 A1 | 7/2008 | | |
| JP | S634205 A | 1/1988 | | |
| JP | H1131863 A | 2/1999 | | |
| JP | H11160510 A | 6/1999 | | |
| JP | 2000258608 A | 9/2000 | | |
| JP | 2001290015 A | 10/2001 | | |
| JP | 2005202104 A | 7/2005 | | |
| JP | 2007057622 A | 3/2007 | | |
| JP | 2007328096 A | 12/2007 | | |
| JP | 2009524229 A | 6/2009 | | |
| JP | 2011215267 A | 10/2011 | | |
| JP | 201564426 A | 4/2015 | | |
| WO | WO-2017091738 A1 * | 6/2017 | | C23C 16/042 |

* cited by examiner

METHOD OF MANUFACTURING A HEIGHT-MODULATED OPTICAL DIFFRACTIVE GRATING

FIELD OF THE INVENTION

The invention relates to manufacturing of micro- and nanostructures for optical purposes. In particular, the invention relates to manufacturing optically diffractive gratings, which can be used for example in display applications, such as near-to-eye displays.

BACKGROUND OF THE INVENTION

Near-to-eye displays (NEDs) and head-up displays (HUDs) typically involve diffractive gratings to produce a viewable image. Gratings are needed as in-coupling gratings, which couple an image from an image source to a wave guide, as out-coupling gratings, which produce the final viewable image for the user, and as exit pupil expanders (EPEs), which increase the size of the displays exit pupil.

The quality and characteristics of the gratings determine the quality of resulting image. In addition to having distinct and consistent grating lines, in advanced applications it is desirable to be able to control the diffraction efficiency of the grating locally. This can be achieved by varying grating line height or fill factor within the grating, i.e. using height or fill factor modulation. To achieve the largest possible efficiency adjustment range, both height and fill factor should be modulated. Thus, there is a need for robust and cost-effective fabrication methods for diffractive gratings in which diffraction efficiency can be freely controlled, and which are applicable for mass production. Moreover, in some cases non-polymeric materials are needed, which adds process complexity in comparison with direct polymer modulation.

Fabrication of height-modulated elements is generally done by repeating fabrication cycles in which one height is defined within one cycle. In particular, fabrication of micro- and nanostructures with varying heights on a same substrate is difficult especially in the case of inorganic materials that are difficult to process. This generally requires several fabrication cycles with alignment, where each element height is defined separately during one cycle.

This also requires highly optimized and often complicated processing of the material. In order to get vertical sidewalls in the material, highly anisotropic etching is required in the currently available methods. One known processing method is discussed in C. David, *"Fabrication of stair-case profiles with high aspect ratios for blazed diffractive optical elements"*, Microelectronic Engineering, 53 (2000). Because of the complexity of the method, the yield of this process is low. Moreover, overlay exposure requires lateral placement accuracy in nanometer level, and any deviations from optimal causes losses in optical performance. Particular challenges are faced when both height modulation and fill factor modulation are desired in order to achieve maximum efficiency adjustment range.

Thus, there is a need for novel industry-scale technologies for height and/or fill factor modulation for diffraction efficiency control.

SUMMARY OF THE INVENTION

It is an aim of the invention to overcome at least some of the abovementioned problems and to provide a novel method for producing height-modulated, and optionally also fill factor-modulated, optically diffractive grating. A particular aim is to provide a method that requires a low number of process steps and in particular, does not require multi-cycle high lateral precision processing in order to achieve the modulation. An aim is also to provide a method that allows for convenient combining height and fill factor modulation.

The invention is based on the idea of manufacturing the grating by the basic steps of first defining the height and optionally fill factor characteristics of the grating by providing a sacrificial structure e.g. by imprinting. Then covering the entire structure by an excess amount of final grating material. Lastly, the excess amount of the final grating material and the sacrificial structure are removed in order to provide a negative of the sacrificial structure.

In more detail, the method of manufacturing a diffractive structure comprises
  providing a substrate,
  manufacturing a plurality of temporary elements of first material onto the substrate, the elements being separated by gaps and arranged as a periodic structure comprising at least two periods having different element heights,
  depositing a coating layer of second material on the plurality of temporary elements such that the coating layer fills said gaps and covers said temporary elements,
  removing a uniform layer of second material in order to expose said temporary elements,
  removing said first material in order to form a height-modulated pattern of said second material onto the substrate as said optically diffractive grating.

More specifically, the method according to the invention is characterized by what is stated in claim 1.

The invention offers significant benefits.

First, the method allows for industry-scale production of high-precision modulated gratings and, in particular accurately height modulated gratings. Fill factor modulation can be combined with height modulation when providing the sacrificial layer on the substrate. This can be carried out using known application methods of etchable sacrificial materials. The temporary element pattern defines the characteristics of the resulting end pattern, which is essentially a negative of the temporary pattern. The temporary element pattern can be easily produced in sufficient accuracy with e.g. polymer imprinting or polymer lithographic techniques, to include e.g. lines of different heights and the remaining steps provide a predictable result.

Second, the depositions of the final grating material can be made as well-known conformal depositions, such as atomic layer deposition (ALD), chemical vapor deposition (CVD) or physical vapor deposition (PVD), and material removals using well-known etching processes that do not require spatial accuracy. As concerns the accuracy of the deposition of the final material, the method is dependent on the layer thickness control, which for example in the mentioned deposition techniques is inherently good. Thus, the method includes a self-assembly mechanism that ensures high quality pattern structure.

Third, the method allows for producing a grating from materials that are difficult to process, in particular inorganic materials having high refractive indices. This is because no high-precision repositioning steps are required when processing the final grating material, but only conformal application and large-area etching steps. There are many high refractive index (n>1.7 and even>2.0) precursor materials available that suit for ALD, CVD or PVD methods, for example, and result in inorganic structures suitable for optical diffractive gratings.

Thus, the invention allows for manufacturing of high-quality variable diffraction efficiency gratings from high refractive index materials, which are required to make e.g. high-quality waveguides with diffractive grating thereon to ensure coupling of light to/from the substrate from/to the grating.

The dependent claims are directed to selected embodiments of the invention.

In some embodiments the temporary elements are line elements for forming an optically diffractive line grating. A line grating can be used as an in-coupling or an out-coupling grating in a diffractive display, such as a NED, or as an EPE between such elements.

In some embodiments the temporary elements are arranged as a periodic structure comprising at least two periods having different element widths in order to provide fill factor modulation in addition to height modulation. This maximizes the achievable range of tuning of local diffraction efficiency of the resulting grating.

In some embodiments the coating layer of the final grating material has essentially constant thickness on top of each temporary element after the deposition, i.e. before the step of removing the uniform layer thereof. This is achievable by using a conformal deposition method for applying the coating layer. The temporary elements may be thereafter exposed by removing a uniform layer of second material, for example using dry or wet etching. Also the temporary elements can be removed by etching, such as dry or wet etching in a separate etching step having different material selectivity than the first etching step.

In some embodiments, after manufacturing the mold, i.e. the temporary elements, an etch stop layer is deposited onto the substrate. The etch stop layer can be removed, at least partially, in a suitable stage of the process. Using an etch stop layer ensures high precision feature height control in the etching stages.

Next, selected embodiments and advantages of the invention are discussed in more detail with reference to the attached drawings.

DETAILED DESCRIPTION OF EMBODIMENTS

Definitions

The term "element" herein means any solid micro- or nanoscale feature rising above the substrate surface and capable of serving, when arranged in a periodic structure, as an elementary block of a diffractive pattern or its intermediate product. A "temporary element" or "sacrificial element" is an element, which is at least partly removed during the process.

The term "line element" or "line" herein refers to an elongated element forming, or used as an intermediate feature to form, the present pattern. Typically, in a diffractive pattern for display applications, a line is a straight ridge having a desired cross-sectional general shape, such as a rectangular or triangular shape. Line elements are typically used in one-dimensional gratings (linear gratings).

The term "fill factor" refers to the proportion of grating structure material to surrounding material (e.g. air or other solid material) within a grating period. In the typical case of rectangular grating lines, this equals to the proportion of line width to period width.

Consequently, "fill factor modulation" refers to variation of fill factor in the lateral dimensions of the grating, i.e. between periods of the periodic structure.

Likewise, "height modulation" refers to variation of element height in the normal direction of the grating. For example, in the case of line elements, element height is the distance between the top of a line (ridge top) and neighbouring pit (valley bottom).

"Conformal deposition" refers to a deposition technique that is capable of producing a conformal material layer, i.e. a layer having an even thickness on all free surfaces of the underlying structure.

Description of Selected Embodiments

Embodiments described herein in detail provide feasible means to fabricate micro- and nanostructures with varying structure height and fill factor (e.g. line width) to a desired material that can be deposited either by physical or chemical vapor deposition methods. In general, the method is based on filling a mold with varying structure heights fabricated in or replicated to a sacrificial material. The excess material on top of the mold is removed by dry or wet etching methods, followed by removal of the sacrificial material. The height of the structures is defined by the height of the sacrificial structures and accuracy of the height modulation can be enhanced in the etch process by an intermediate etch stop layer.

Sacrificial Layer (Mold)

Figure 1A:
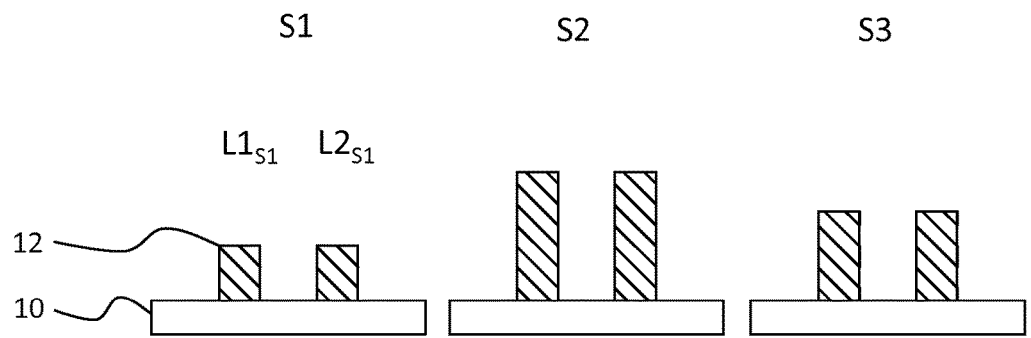
FIGS. 1A-1D illustrate, step by step, in cross-sectional views of a structure produced according to one embodiment of the invention.

In the first step illustrated in FIG. 1A, height modulated temporary structures 12 are fabricated on a substrate 10 using a sacrificial material. In the illustrated example, there are three sections S1, S2 and S3 with two elements (rectangular lines) in each section with different element heights between sections. The temporary structures 12 can be applied e.g. by optical lithography, electron beam lithography, embossing or nanoimprint lithography. A photo or electron beam resist or spin-on carbon can be used, for example. The modulation can also include modulation of line width.

In real structures, the number of elements in each section or the number of sections may be much higher. Instead of comprising distinct sections, the height modulation may also comprise continuous gradient of different element heights. Typically the sections form a continuous structure on a single substrate although herein illustrated separated for the purposes of clarity.

Final Material Deposition

Figure 1B:
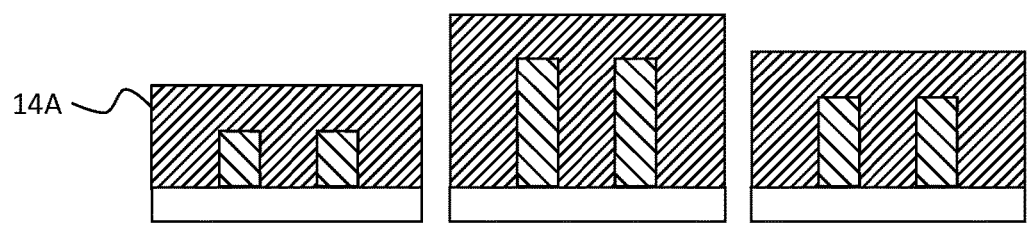

Next, as illustrated by FIG. 1B, a coating layer 14A is applied on the mold formed by the substrate 10 and the temporary elements 12. The coating layer 14A fills the gaps between the temporary elements 12 within each section and also between them and covering also the temporary elements 12. A conformal deposition technique, such as ALD, CVD or PVD is preferred for ensuring filling of the gaps and uniform coverage on top of the temporary elements 12. Due to deposition conformality, any height is filled equally. Within each section S1, S2, S3 the surface is planarized, whereas there are steps between the sections S1, S2, S3.

Excess Material Removal

Figure 1C:
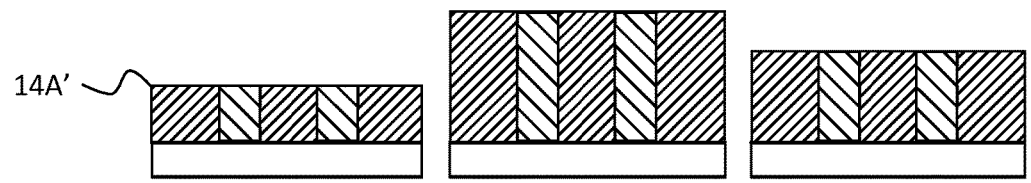

Next, as illustrated by FIG. 1C, the excess coating on top of the sacrificial layer is removed by wet or dry etching such that the temporary structures 12 are exposed from the top direction and a modified coating layer 14A' remains. Due to the conformal deposition used in the previous step, removal of the same thickness at each section is sufficient to expose all structures 14A irrespective of their height.

Figure 1D:
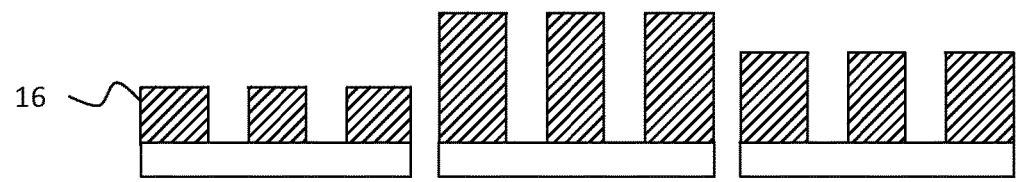

Finally, as shown in FIG. 1D, sacrificial layer, i.e., temporary structures 12 are removed using dry or wet etching. This results in a negative copy of the mold of FIG. 1A, i.e., grating elements 16 of different heights defined by the heights of the temporary structures 12. If element width variations are present in the mold in addition to height variations, they are also replicated in the end product as a negative.

General Considerations and Variations

The described process simplifies manufacturing of variable efficiency modulated gratings significantly as all different height variations can be fabricated simultaneously in one fabrication cycle. The resulting structure is ready to be used as a diffractive grating. If the substrate 10 is optically transparent, optical waves propagating laterally in the substrate may be coupled to the grating and waves hitting the grating may be coupled into the substrate. In some embodiments, the substrate 10 has a refractive index smaller than the coating material forming the grating elements 16.

In addition to the benefit that the features and vertical profiles are defined in the resist mould, also the requirements of processing of the coating material are relaxed because the processing is only used for excess material removal (step from FIG. 1B to FIG. 1C) and high anisotropy is not required. Due to the complete filling of the mold in the final material deposition stage, the fill ratio of the final structure is completely defined by the period of the grating, widths and gaps of the temporary lines.

Figure 3:
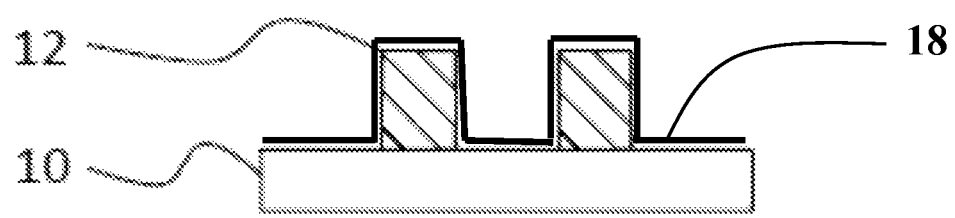
FIG. 3 shows labelled representations of an etch stop layer applied after the step of FIG. 1A.

In some embodiments, to ensure very high accuracy in the height modulation over an etch step, an additional etch stop layer 18 is applied between the temporary elements 12 and/or substrate 10 and the coating layer 14A, that is, after the step of FIG. 1A, the etch stop layer 18 being shown as labelled representations within FIG. 3, the labelled representations not being indicative of relative size or placement. This layer has high etch selectivity to the material to be etched. The etch stop layer can be finally removed by a wet process, though it can remain between the grating elements 16 and the substrate 10. Therefore, the etch stop layer preferably also has a high refractive index and is also otherwise optically suitable as grating material. The combination can be, for instance, an $HfO_2$ etch stop layer with a titanium dioxide grating layer. The etch stop layer can be applied for example by ALD, CVD or PVD method.

The final material may be a compound of inorganic materials, in particular a compound which forms an optically transparent material, such as an oxide or nitride compounds. In particular, the final material may comprise material whose index of refraction is 2.0 more, such as 2.2 or more. The material can be e.g. example $TiO_2$, $Si_3N_4$ or $HfO_2$.

The substrate 10 is preferably optically transparent, such as a glass substrate or polymer substrate. Transparent herein means transmittance higher than 50%, in particular higher than 95%. For display applications it is preferred that the substrate is capable of serving as a waveguide for visible optical wavelengths (i.e. as a light guide). The substrate can be planar or curved.

In typical embodiments, the final material has an index of refraction equal or higher than that of the substrate material. This allows for the light travelling in the substrate via total internal reflections to exit the substrate at the location of the grating and the diffraction to take place. For example the index of refraction of the substrate can be less than 2.0 and the index of refraction of the grating material more than 2.0.

The present invention can be used to manufacture gratings for display applications, such as wearable display applications, for example virtual reality or augmented reality glasses. In these applications, the area of the pattern manufactured is typically at least 1 $cm^2$, such as 2-500 $cm^2$.

The diffractive grating may be e.g. an out-coupling grating, an in-coupling grating or an exit pupil expander (EPE) of a near-to-eye display (NED) or head-up display (HUD).

The period of the pattern is typically 10 μm or less, in particular 1 μm or less, such as 200-800 nm. It should be noted that in addition to constant-period gratings, the invention can also be used to produce period modulated gratings. That is, the period does need to be constant in the lateral dimension of the grating.

If needed, the grating can be embedded in an optical structure, i.e. covered or coated with one or more additional layers.

Figure 2A:
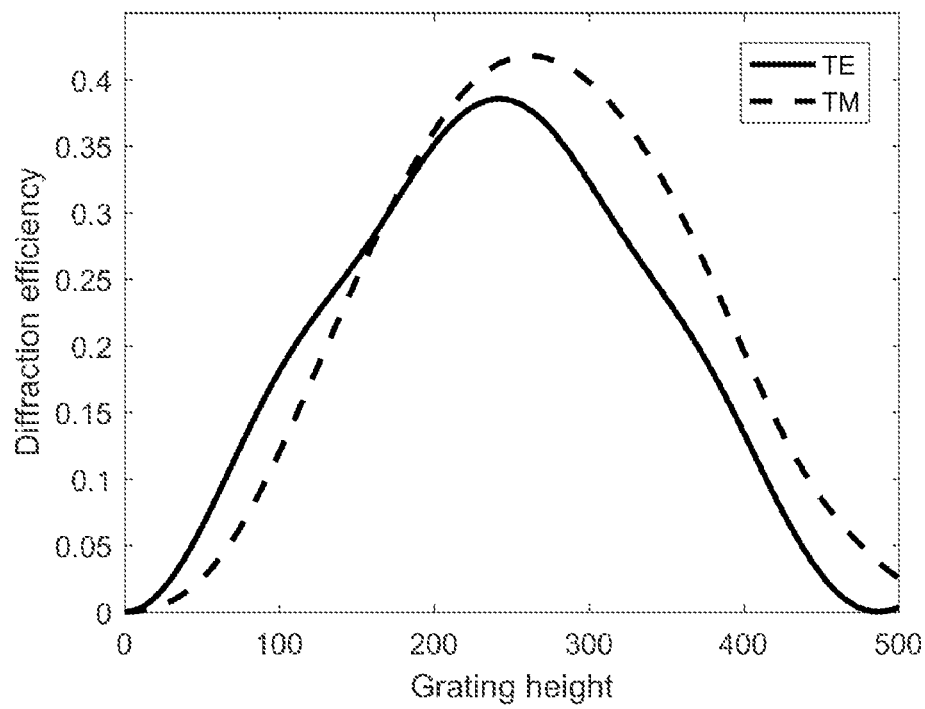
FIG. 2A shows an example how diffraction efficiency of the first transmission order of a binary 1D grating changes as a function of the grating height.
Figure 2B:
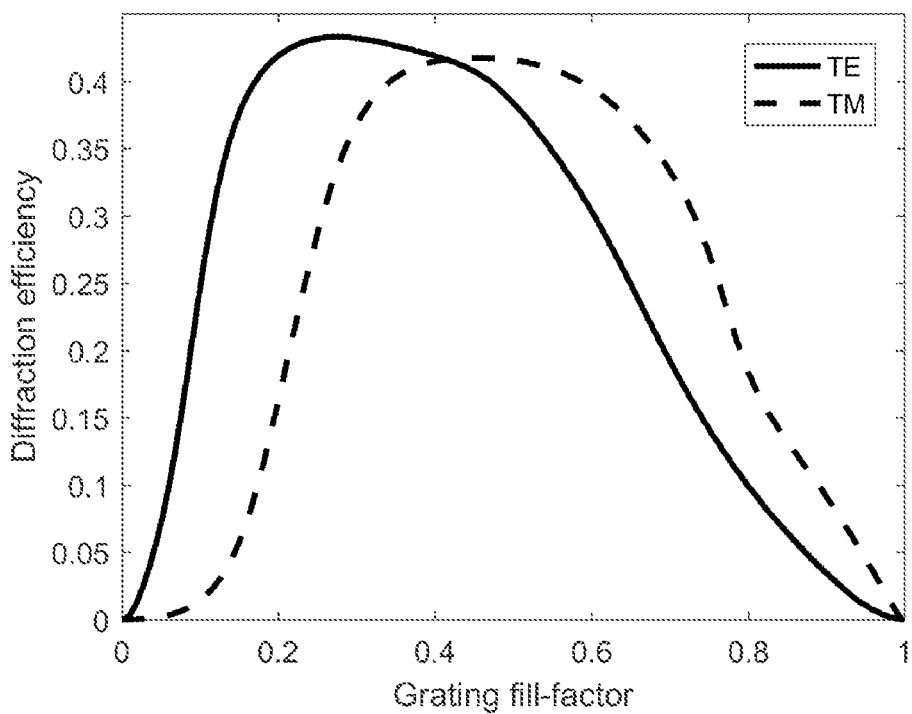
FIG. 2B shows an example how diffraction efficiency of the first transmission order of a 1D grating changes as a function of the grating fill-factor.

FIGS. 2A and 2B show how the diffraction efficiency of the first transmission order of a dielectric binary grating can be modulated using height and fill-factor modulation. Numerical results were obtained with the Fourier modal method (also known as rigorous coupled wave analysis). The binary grating resides on an interface between air and a glass substrate having refractive index of 2.0, the grating period is 500 nm, fill factor 0.5, and the grating is made of the same material as the substrate. The grating is illuminated with a plane wave with 450 nm free space wavelength at normal incidence. Results are shown for both transverse electric (TE) and transverse magnetic polarizations (TM). In FIG. 2A, the grating fill factor is 0.5 and in FIG. 2B, the grating height is 250 nm.

CITATIONS LIST

Non-Patent Literature

C. David, "*Fabrication of stair-case profiles with high aspect ratios for blazed diffractive optical elements*", Microelectronic Engineering, 53 (2000).

The invention claimed is:

1. A method of manufacturing a height-modulated optically diffractive grating, comprising:
   providing a substrate,
   manufacturing a plurality of temporary elements of first material onto the substrate, the elements being separated by gaps and arranged as a periodic structure comprising at least two periods having different element heights,
   depositing a coating layer of second material on the plurality of temporary elements such that the coating layer fills said gaps and covers said temporary elements, wherein said coating layer is a conformal layer,
   removing a uniform layer of second material in order to expose said temporary elements, and
   removing said first material in order to form a height-modulated pattern of said second material onto the substrate as said optically diffractive grating.

2. The method according to claim 1, wherein the temporary elements are line elements for forming an optically diffractive line grating.

3. The method according to claim 1, wherein the temporary elements are arranged as a periodic structure comprising at least two periods having different element widths in order to form a height and fill factor modulated pattern of second material as said optically diffractive grating.

4. The method according to claim 1, wherein said coating layer, before the step of removing the uniform layer thereof, has essentially constant thickness on top of each temporary element.

5. The method according to claim 1, wherein said removing of the uniform layer of second material comprises etching.

6. The method of claim 5, wherein the etching is dry or wet etching.

7. The method according to claim 1, wherein said removing of the first material comprises etching.

8. The method of claim 7, wherein the etching is dry or wet etching.

9. The method according to claim 1, comprising, after the step of manufacturing the temporary elements, depositing an etch stop layer onto the substrate.

10. The method of claim 9, further comprising the step of removing the etch stop layer after removing said first material.

11. The method according to claim 1, wherein the coating layer is deposited using atomic layer deposition (ALD), chemical vapor deposition (CVD) or physical vapor deposition (PVD) or variants thereof.

12. The method according to claim 1, wherein the second material is inorganic transparent material.

13. The method of claim 12, wherein the second material an oxide or nitride compound.

14. The method of claim 12, wherein the second material is selected from: $TiO_2$, $Si_3N_4$ or $HfO_2$.

15. The method according to claim 1, wherein the index of refraction of the second material is 1.7 or more.

16. The method according to claim 1, wherein the substrate is an optically transparent substrate.

17. The method of claim 16, wherein the optically transparent substrate is selected from: a glass substrate, polymer substrate, and a planar substrate capable of serving as a light guide.

18. The method according to claim 1, wherein the second material comprises optically transparent material having an index of refraction higher than that of the substrate material.

19. A height-modulated optically diffractive grating manufactured using a method of manufacturing a height-modulated optically diffractive grating, the method comprising:
providing a substrate,
manufacturing a plurality of temporary elements of first material onto the substrate, the elements being separated by gaps and arranged as a periodic structure comprising at least two periods having different element heights,
depositing a coating layer of second material on the plurality of temporary elements such that the coating layer fills said gaps and covers said temporary elements, wherein said coating layer is a conformal layer,
removing a uniform layer of second material in order to expose said temporary elements, and
removing said first material in order to form a height-modulated pattern of said second material onto the substrate as said optically diffractive grating.

20. The grating according to claim 19, wherein the grating is an in-coupling grating, exit pupil expander grating or out-coupling grating of a diffractive waveguide display.

* * * * *